(12) United States Patent
Fan et al.

(10) Patent No.: US 9,647,143 B2
(45) Date of Patent: May 9, 2017

(54) NON-VOLATILE MEMORY UNIT AND METHOD FOR MANUFACTURING THE SAME

(71) Applicant: Xinnova Technology Limited, Beijing (CN)

(72) Inventors: Der-Tsyr Fan, Taoyuan County (TW); Chih-Ming Chen, Hsin-chu (TW); Jung-Chang Lu, Hsin-chu (TW)

(73) Assignee: XINNOVA TECHNOLOGY LIMITED, Beijing (CN)

( * ) Notice: Subject to any disclaimer, the term of this patent is extended or adjusted under 35 U.S.C. 154(b) by 0 days.

(21) Appl. No.: 14/994,852

(22) Filed: Jan. 13, 2016

(65) Prior Publication Data

US 2016/0204274 A1 Jul. 14, 2016

Related U.S. Application Data

(60) Provisional application No. 62/102,639, filed on Jan. 13, 2015.

(51) Int. Cl.
| | |
|---|---|
| *H01L 29/788* | (2006.01) |
| *H01L 21/265* | (2006.01) |
| *H01L 21/28* | (2006.01) |
| *H01L 27/11521* | (2017.01) |
| *H01L 29/40* | (2006.01) |
| *H01L 29/423* | (2006.01) |
| *H01L 29/66* | (2006.01) |
| *H01L 21/02* | (2006.01) |
| *H01L 27/11524* | (2017.01) |

(52) U.S. Cl.
CPC .... *H01L 29/7883* (2013.01); *H01L 21/26513* (2013.01); *H01L 21/28273* (2013.01); *H01L 27/11521* (2013.01); *H01L 29/401* (2013.01); *H01L 29/42328* (2013.01); *H01L 29/66825* (2013.01); *H01L 21/02238* (2013.01); *H01L 27/11524* (2013.01)

(58) Field of Classification Search
CPC ........... H01L 29/7883; H01L 21/28273; H01L 29/42328; H01L 29/66825; H01L 27/11521; H01L 27/11524
See application file for complete search history.

(56) References Cited

U.S. PATENT DOCUMENTS 7,439,133 B2 * 10/2008 Chou .................... H01L 27/115
257/E21.682

* cited by examiner

*Primary Examiner* — David Vu
(74) *Attorney, Agent, or Firm* — Chun-Ming Shih; HDLS IPR Services (57) ABSTRACT

A non-volatile memory unit and method of manufacturing the same are disclosed. The non-volatile memory unit includes a substrate with a source region and a drain region. A first dielectric layer forms on the substrate. An erase gate, a floating gate and couple control gate are forms on the first dielectric layer. The coupled dielectric layer are formed among and above the erase gate, the floating gate and the selective gate, and formed on the couple gate of the coupled dielectric layer.

6 Claims, 6 Drawing Sheets

NON-VOLATILE MEMORY UNIT AND METHOD FOR MANUFACTURING THE SAME

BACKGROUND

Technical Field

This disclosure relates to non-volatile memory unit and method for manufacturing the same, in particular, to a unit and method that could form an erase gate (EG) with a relative wide base that tapering upward the top, in order to let the floating gate (FG) to insert below portion of the erase gate (EG). Therefore, the rapid erasing effect of particular portion of the electric field could be enhanced.

Related Art

A split gate non-volatile memory unit is widely used in independent and embedded type non-volatile application. Since it has a smaller sector cleaning and a more easily supported circuit design, in the embedded non-volatile IC industry it becomes more and more important. For instance, could be used at the MCU and smartcard.

In previous non-volatile memory units of split gate of the Microchip™ and SST™ are consider to be easily manufactured and have a reliable reliabilities, thus are considered a most approval solution nowadays. In the core of the non-volatile memory unit, double layered polycrystalline silicon layer is consider as the floating gate of the first polycrystalline silicon layer and selective gate of the second polycrystalline silicon layer. As the IC device become smaller and smaller, the double polycrystalline silicon of slit gate could not satisfy the nowadays' trend.

By adding addition polycrystalline silicon layer for couple control gate, the tri-polycrystalline silicon split gate is getting smaller and also gains its importance. In the core of the non-volatile, in this technique, the three-layer polycrystalline silicon is considered as the floating gate of the first polycrystalline silicon layer, the second polycrystalline silicon layer as couple control gate, and the third polycrystalline silicon layer as erase gate/selective gate.

Similar to convention non-volatile memory unit of stacking gate, such as ETOX. First of all, formed the floating gate along the bit line direction, and formed the couple control gate (CG) as mask for etching the floating gate. By back-etching tri-polycrystalline silicon to form the erase gate and the select separator of the erase gate and selective gate. Since the erase gate and select separator includes different gate dielectric for different usage, so the fabrication process of the transistor oxide layer of the selective gate and the tunnel oxide layer have to be carefully consider.

Unfortunately, at the existing split gate structure and manufacturing method the above said request are hard to realize. The dielectric between the floating gate and the selective gate has to integrate to the combination of the tunneling oxide layer, which disposed between the floating gate and the selective gate. Therefore, the manufacturing process will be more complicate and lack of flexibility thus became a closed system. Finally and most importantly, now existing tri-polycrystalline silicon split gate cannot avoid involving etching, and growing of the oxidizing layer with rough surface of the floating gate. The floating gate is used in erasing the nodes. Assume that the surface of the polycrystalline silicon and the tunneling oxide layer are not carefully handle, the uneven micro surface structure of the floating gate polycrystalline silicon will not be able to cause the tunneling effect of the tunnel oxidation layer thus affect the reliability.

SUMMARY

In view of the aforementioned problems, this disclosure provides a non-volatile memory unit and method for manufacturing the same, to a damascene and a flattening process using dielectric layer for hard mask to form the erase gate (EG) and the selective gate (SG).

Another objection of the present invention is to provide a non-volatile memory unit and method that could form an erase gate (EG) with a relative wide base that tapering upward the top, in order to let the floating gate (FG) to insert below portion of the erase gate (EG). Therefore, the rapid erasing effect of particular portion of the electric field could be enhanced.

Accordingly, this disclosure provides a method for manufacturing a non-volatile memory unit that comprises: providing a substrate; formed a base dielectric layer on the substrate; formed a first polycrystalline silicon layer on the a base dielectric layer and formed a sacrificial layer on the first polycrystalline silicon layer selectively removing the sacrificial layer, a first temporally sidewall dielectric layer is forming at two sides of the sacrificial layer; selectively removing the sacrificial layer, a first temporally sidewall dielectric layer is forming at two sides of the sacrificial layer; the first polycrystalline silicon layer and the sacrificial layer together forms several stacked structures on the base dielectric layer, wherein the stacked structures have a relative wide base that tapering upward the top, between the adjacent stacked structures form damascene grooves; performing ion implantation according to the first pattern opening; thicken the thickness of the damascene grooves of the base dielectric layer under the first pattern opening; formed a first sidewall dielectric layer at the damascene grooves, and formed two damascene grooves along the first sidewall dielectric layer; formed a second polycrystalline silicon layer at the two damascene grooves; removing the second polycrystalline silicon layer of the second pattern opening of the two damascene grooves and the first sidewall dielectric layer; formed a third pattern opening on the substrate, and the first polycrystalline silicon layer and the base dielectric layer of the third pattern opening in order to form a first groove; formed a transistor dielectric layer and a second sidewall dielectric layer, and the transistor dielectric layer and the second sidewall dielectric layer together formed a second groove; formed a third polycrystalline silicon layer at the second groove; formed a covering dielectric layer on the second polycrystalline silicon layer and the third polycrystalline silicon layer; formed a coupled dielectric layer on the first polycrystalline silicon layer, the covering dielectric layer, the first sidewall dielectric layer and the second sidewall dielectric layer; selectively formed a fourth polycrystalline silicon layer on the coupled dielectric layer; and performing ion implantation according to the fourth pattern opening.

According to one embodiment of the present invention, wherein step (4) further comprising steps of: forming a floating gate (FG) on the first base dielectric layer between the first pattern opening and the second pattern opening.

According to one embodiment of the present invention, wherein step (5) further comprising steps of: selectively removing the sacrificial layer, via the lithography method defines part of the sacrificial layer as mask and anisotropic etching two sides of the sacrificial layer, the width of the sacrificial layer along the horizontal direction is decreased.

According to one embodiment of the present invention, wherein step (5-1) further comprises: removing the temporally first sidewall dielectric layer, the width of the first polycrystalline silicon layer is wider than the sacrificial layer, in order to form tacked structures with a relative wide base that tapering upward the top.

According to one embodiment of the present invention, wherein the second polycrystalline silicon layer of step (10) further comprises: formed the first polycrystalline silicon layer, the sacrificial layer and the sidewall dielectric layer, in order to form tacked structures with a relative wide base that tapering upward the top.

According to one embodiment of the present invention, removing the scarifying layer according to the mask that defined by the covering dielectric layer of the second and the third polycrystalline silicon layer, wherein the first sidewall dielectric layer along the horizontal direction, outside the second sidewall dielectric layer and the covering dielectric layer, the the scarifying layer that stacked on the first polycrystalline silicon layer are removed.

According to one embodiment of the present invention, wherein deposit the couple gate (CG) on the first polycrystalline silicon layer and the inner transistor dielectric layer, the couple gate is stacked at the region of the couple gate and the base dielectric, along the depth direction the fourth pattern opening.

The substrate has a source region and a drain region formed on the surface of the substrate, and the source region and the drain region are separated apart via a channel region. The first dielectric layer forms on the substrate and defines a first pattern opening along the depth direction on the first dielectric layer. The erase gate (EG) forms on the first dielectric layer and disposed upon the first pattern opening's projection along the depth direction. The floating gate (FG) forms on the first dielectric layer and near the erase gate. The selective gate (SG) forms on the first dielectric layer and near the floating gate, wherein the selective gate and the floating gate are disposed upon the projection of the channel region along the depth direction. The second dielectric layer forms on the first dielectric layer and covers the erase gate and the selective gate, wherein the floating gate is disposed between two adjacent second dielectric layers. The coupled dielectric layer, formed on the erase gate, the floating gate, the selective gate and the second dielectric layer. The couple gate (CG), formed on the coupled dielectric layer.

A first pattern opening of the first dielectric layer has a first thickness. The first dielectric layer below the projection of the floating gate has a second thickness, and the thickness of the first dielectric layer below the projection of the selective gate is defined as a third thickness. The first thickness is thicker than the second thickness, and the second thickness is thicker than the third thickness.

According to one embodiment of the present invention, wherein the projection of the relative narrow portion of the erase gate (EG) that disposed at the damascene grooves is disposed above the first pattern opening along the depth direction, and the erase gate (EG) is narrower than the first pattern opening along the horizontal direction, wherein the damascene grooves have a relative wide base that tapering upward the top.

According to one embodiment of the present invention, wherein the second dielectric layer is disposed between the two sides of the erase gate (EG) and the second dielectric layer is formed between the erase gate (EG) and the floating gate (FG).

According to one embodiment of the present invention, wherein the coupled dielectric layer is formed into a continuous concave and convex shape and covers the second dielectric layer, the erase gate (EG), the selective gate (SG) and the floating gate (FG), along the depth direction the coupled dielectric layer on the floating gate is relatively near the first dielectric layer corresponding to the erase gate (EG) and the selective gate (FG).

According to one embodiment of the present invention, wherein the first dielectric layer comprises a transistor dielectric layer and a base dielectric layer.

According to one embodiment of the present invention, wherein the second dielectric layer comprises a covering dielectric layer, a first sidewall dielectric layer and a second sidewall dielectric layer.

BRIEF DESCRIPTION OF THE DRAWINGS

This disclosure will become more fully understood from the detailed description given herein below for illustration only, and thus not limitative of this disclosure, wherein.

DETAILED DESCRIPTION

In the following description related to semiconductor processes, the terms common in the semiconductor processing field, such as the techniques of "formation of an oxidation layer", "lithography", "etching", "cleaning", "diffusion", "ion implantation", "chemical and physical vapor deposition", will not be described to avoid redundancy if these terms do not involve the technical features of the present invention.

Present invention disclosed a scale-down, reliable polycrystalline silicon to polycrystalline silicon, and characterize at erasing at the interface of polycrystalline silicon to source gate. Present invention is related to structure and manufacture method of a non-volatile memory unit 2 of fourth-polycrystalline silicon split gate.

Formed tri-polycrystalline silicon split gate according to conventional method, the erase gate (EG) 21 and the selective gate (FG) 22 could use the two sides of the floating gate (FG) 23 and the control gate (CG) to operate. By enhancing the rapid erasing effect of particular portion of the electric field, the operating erasing efficiency of the small current will be determined by the erasing tunneling oxide layer. Nevertheless, the reliability will be scarified due to realize the objection of rapidly erasing. Therefore, the fourth-polycrystalline silicon split gate of the present invention, with the help of the depositing and flattening processes of the first polycrystalline silicon, and the scarifying layer 16 (such as silicon nitride, silicon oxidation, or the combination of the two) could formed into a damascene stable unit structure, with a relative wide base that tapering upward the top stacked structure, for erasing the pattern definitions of the erase gate (EG) 21 and the selective gate (FG) 22.

In present invention a method for manufacturing a non-volatile memory unit (S1) is provided. More particularly, the non-volatile memory unit 2 is fourth-polycrystalline silicon split gate 1. Please refer to FIG. 1A. First of all, provides a substrate 10 (S101). The substrate 10 could be p-type or n-type substrate. Via some technique of the conventional semiconductor process, multiple layers are stacked on the substrate 10 to provide the semiconductor unit. Then, forms a base dielectric layer 101 on the substrate 10, the base dielectric layer 101 could be made of silicon oxide ($SiO_2$).

Figure 1A:
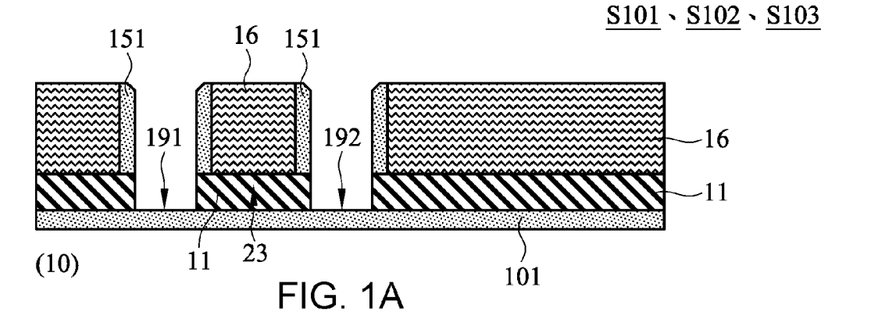
FIG. 1A-1N are cross-sectional views illustrating the non-volatile memory unit and the formation of the non-volatile memory unit according to the present invention.

By the high-temperature thermal oxidation, the silicon substrate is oxidized to silicon oxide, which thickness is range from 50-150 nm.

A first polycrystalline silicon layer 11 is formed on the base dielectric layer 101m and the sacrificial layer 16 is stacked on the first polycrystalline silicon layer 11. Further, defines a pattern on the photoresist as a mask via lithography mean. The first polycrystalline silicon layer 11 and the sacrificial layer 16 are etched, and a first pattern opening 191 and a second pattern opening 192 of the first polycrystalline silicon layer 11 and the sacrificial layer 16 are formed on the base dielectric layer 101 (step 102).

Defines part of the sacrificial layer 16 as mask via lithography mean, apply anisotropic etching on the sacrificial layer 16. Two sides of the sacrificial layer 16 are removed and the width along the horizontal of the sacrificial layer 16 is decreased. For instance, as for anisotropic etching, a deep reactive ion etching (DRIE) could be apply for dry etching, for realizing a greater etching speed along vertical direction than horizontal direction, and a high aspect ratio etching. Then, after removing two sides of the sacrificial layer 16, a first temporally sidewall dielectric layer 161 is formed. The sacrificial layers 16 and the first temporally sidewall dielectric layer 161 and the first polycrystalline silicon layer 11 are double-stacked.

In addition, the sacrificial layers 16 is stacked on the first polycrystalline silicon layer 11 and the first temporally sidewall dielectric layer 161. The first temporally sidewall dielectric layer 161 is formed at two sides of the sacrificial layers 16. Therefore, along the horizontal direction the width of the first polycrystalline silicon 11 is wider than the sacrificial layers 16.

As for the pattern opening, a photoresist layer or a mask layer is made in advance. By the means of lithography or with the combination of lithography and etching technique, the photoresist is patterned. Therefore, there will be no photoresist or mask within this region, photoresist or mask will only dispose outside this region. The vacant or opening at the photoresist or mask layer is called pattern opening.

In addition, outside the first pattern opening 191 and the second pattern opening 192 of the base dielectric layer 101, the sacrificial layers 16, and the first temporally sidewall dielectric layer 161 and the first polycrystalline silicon 11 together formed a double-stacked structure with a relative wide base that tapering upward the top. Among the first temporally sidewall dielectric layers 161, each of the first temporally sidewall dielectric layer 161 are separated. For example, after the polycrystalline silicon is deposited, the polycrystalline silicon will be etched to a predetermined thickness. To be noted that between the first pattern opening 191 and the second pattern opening 192 on the base dielectric layer 101, forms the first polycrystalline silicon layer 11 which is the floating gate (FG) 23.

In one of the embodiment of present invention, the thickness of the sacrificial layer 16 is range from 200-1500 nm, preferably 700 nm. Sacrificial layer 16 could be a single silicon nitride (SiN) layer, nitride-oxide-silicon complex (SiON), or a multiple stacked dielectric layer. The multiple stacked dielectric layer could be oxide-nitride-oxide (ONO) or oxide-nitride-oxide-nitride (ONON). Others, the thickness of the first polycrystalline silicon 11 ranges from 300-2000 nm, preferably 1000 nm.

Figure 1B:
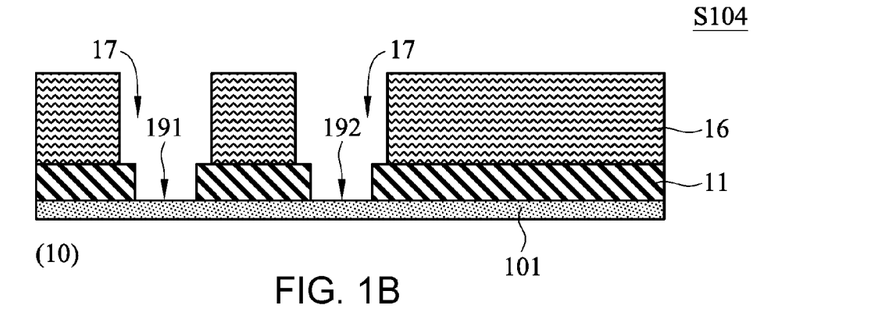
Figure 1C:
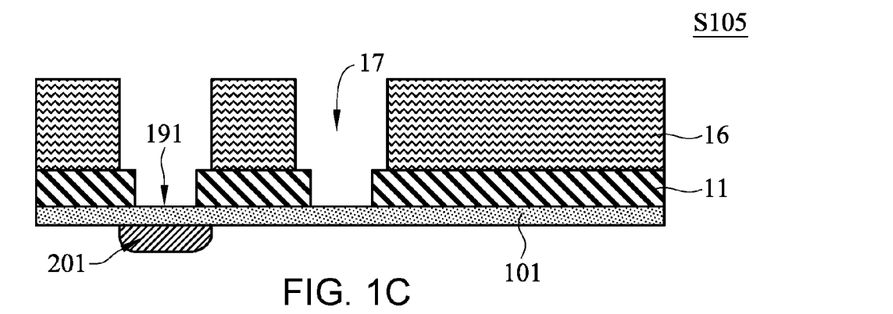

Please refer to FIG. 1B, the first temporally sidewall dielectric layer 161 of the first polycrystalline silicon layer 11 and the first temporally sidewall dielectric layer 161 of at two sides of the sacrificial layers 16 are removed (S104). After removing the first polycrystalline silicon layer 11, the first temporally sidewall dielectric layer 161 and the first polycrystalline silicon 11 together formed a stacked structure 18 with a relative wide base that tapering upward the top. Further, the base width of the stacked structure 18 of the first polycrystalline silicon layer is wider than that of the sacrificial layers 16 on the top. Please refer to FIG. 1C. Performing ion implantation at the substrate 10 according to the first pattern opening 191 (S105), and the source region 201 is formed on the surface of the substrate 10. For instance, one could apply ion implantation performing step on a p-type substrate for a N-well source region 201.

Figure 1D:
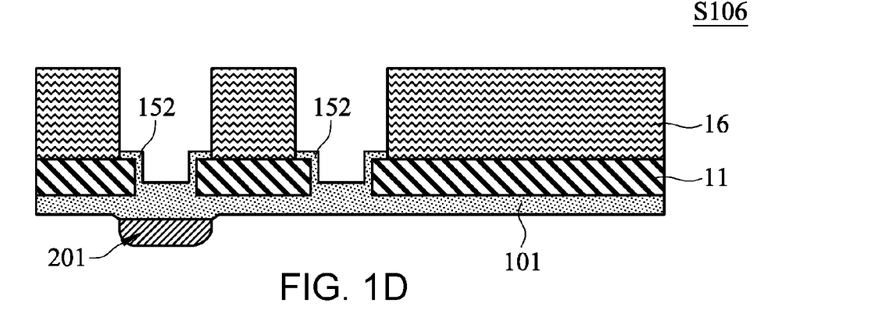
Figure 1E:
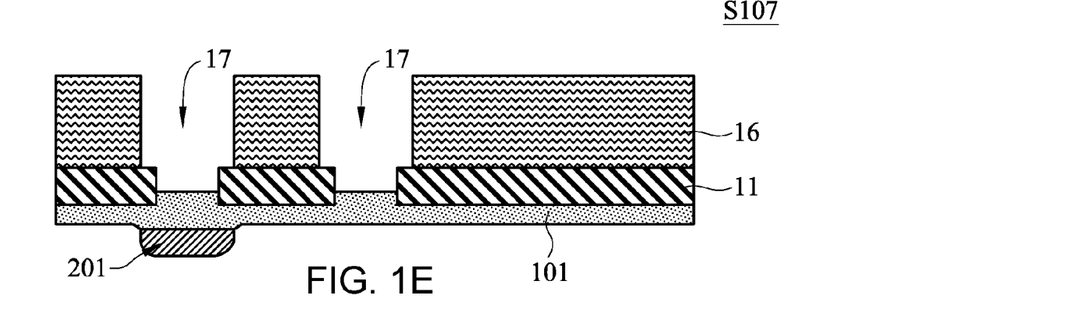

Please refer to FIG. 1E, via the lithography defines a pattern on the photoresist of the first polycrystalline silicon layer 11 as a mask. The temporally sidewall dielectric layer 152 on the first polycrystalline silicon layer 11 will be removed (S107). More important, the stacked structures 18 with a relative wide base that tapering upward the top are separated on the substrate 10 and form damascene trenches 17. The damascene trenches 17 are disposed above the first pattern opening 191 and the second pattern opening. Others, in step S106, oxidize and thicken the base dielectric layer 101 below the first pattern opening 191, therefore corresponding to the second pattern opening 192, the membrane thickness of the damascene trenches 17 under the first pattern opening 191 of the base dielectric layer 101 is thicker.

Figure 1F:
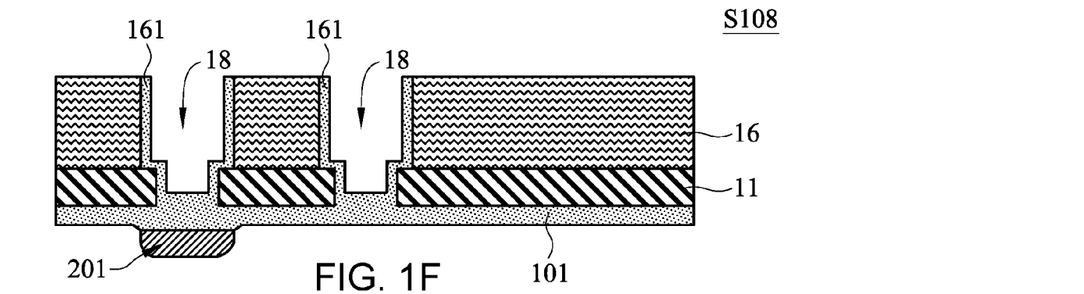

Please refer to FIG. 1F, via the lithography defines the region outside of damascene trenches 17 as a mask. In the damascene trenches 17 (the sacrificial layers 16 and the sidewall of the first polycrystalline silicon layer 11) form a first sidewall dielectric layer 161 (S108). Others, the first sidewall dielectric layer 161 connects the base dielectric layer under the first pattern opening 191 and the second pattern opening 192 to form a continuous isolated dielectric layer. For instance, by the means of high temperature oxidation or chemical vapor deposition the silicon substrate is oxidized to silicon oxide, and the first sidewall dielectric layer 161 is formed.

In addition, a sidewall dielectric layer 161 is formed at the damascene trench 17, the sacrificial layers 16 and the sidewall of the first polycrystalline silicon layer 11. The sidewall dielectric layer 161 connects the base dielectric layer 10 and forms two notches 18. The notch 18 is disposed above the first pattern opening 191 and with structure with a relative wide base that tapering upward the top. Further, the wide part of the base width of the notch 18 is wider than that of the first pattern opening 191 along the horizontal direction. The narrow part of the top width of the notch 18 is thinner than that of the first pattern opening 191 along the horizontal direction. In brief, the difference between the damascene trenches 17 and the notch 18 is that the damascene trench 17 includes the notch 18 and the first sidewall dielectric layer 161.

Be noted that since the width of the top of the sacrificial layers 16 that formed separated along the horizontal direction is wider than that of the first polycrystalline silicon layer 11, the damascene trench 17 will be formed to a structure with a wide base that tapering upward the top. Similarly, since the width of interval formed by the sacrificial layers 16 and the first sidewall dielectric layer 161 is wider than the interval width formed by the first polycrystalline silicon layer 11 and the first sidewall dielectric layer 161, the notch 18 will be formed into a structure with a wide base that tapering upward the top. Please refer to FIG. 1G, via the lithography defines the region outside of the notch 18 as a mask. A second polycrystalline silicon layer 12 is formed into the two notches 18 (S109). In other way of speaking, the second polycrystalline silicon layer 12 is filled into the first pattern opening and formed into a shape that wide at base and tapering upward the top, which is erasing gate (EG) 21. For example, by the means of high temperature oxidation or chemical vapor deposition, after disposing the poly-Si, the poly crystalline silicon is etched to a predetermined thickness to form into the erase gate (EG) 21.

Please refer to FIG. 1D, via the first pattern opening 191, defines the region outside the first pattern opening 191 as a mask, and oxidized and thickened the base dielectric layer 101 below the first pattern opening (S106). At the same time, after the first temporally sidewall dielectric layer 161 is removed, oxidized the sidewall of the first polycrystalline silicon layer 11 and oxidized the region that the first polycrystalline silicon layer 11 and the first temporally sidewall dielectric layer 161 used to be contacted. Thus, form a second temporally sidewall dielectric layer 162.

Figure 1G:
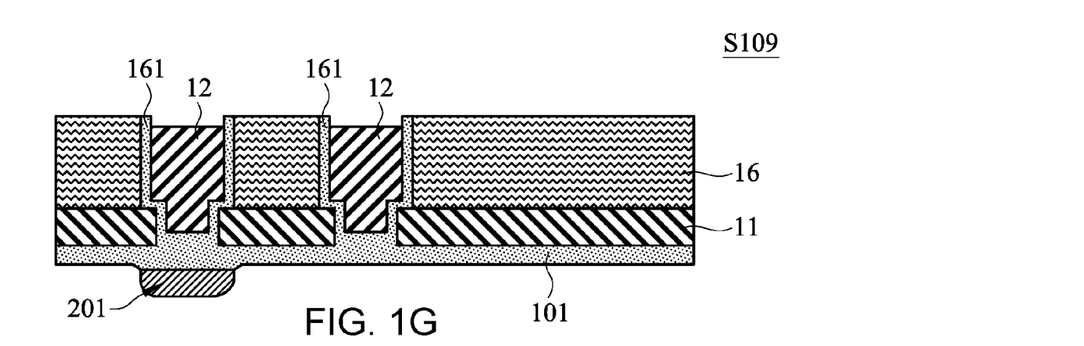
Figure 1H:
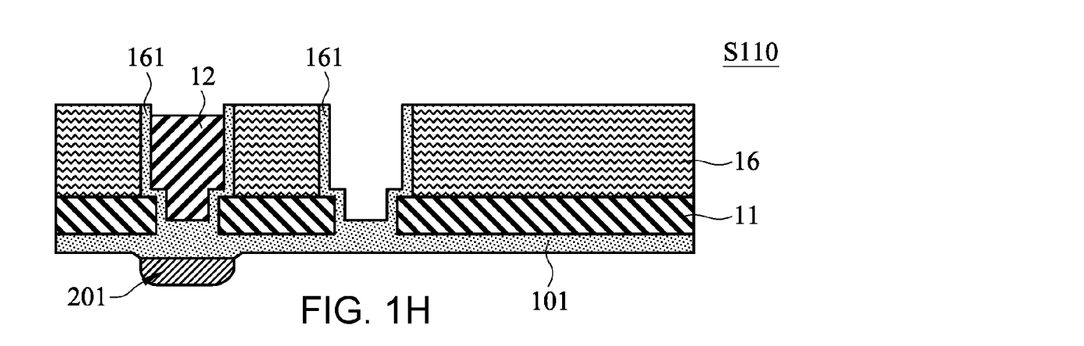

Please refer to FIG. 1H, by the means of lithography outside the notch 18 of the second pattern opening 192 is defined as a mask. The second polycrystalline silicon layer 12 of the notch 18 of the second pattern opening 192 is removed (S110).

Figure 1I:
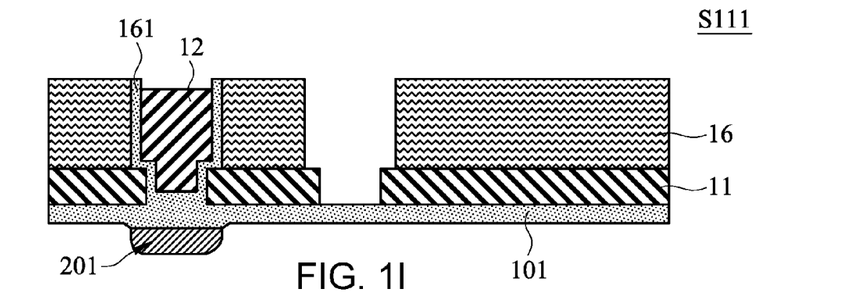

Then, please refer to FIG. 1I, by the means of lithography the region outside the second pattern opening 192 is defined as a mask, and the first sidewall dielectric layer 161 above the second pattern opening 192 is removed (S111). For example, by reactive ion etching or by wet etching the silicon nitride of the second polycrystalline silicon layer 12 is removed. Similarly, wet etch or dry etch the first sidewall dielectric layer 161 at this region, while the other layers will not be affected.

Figure 1J:
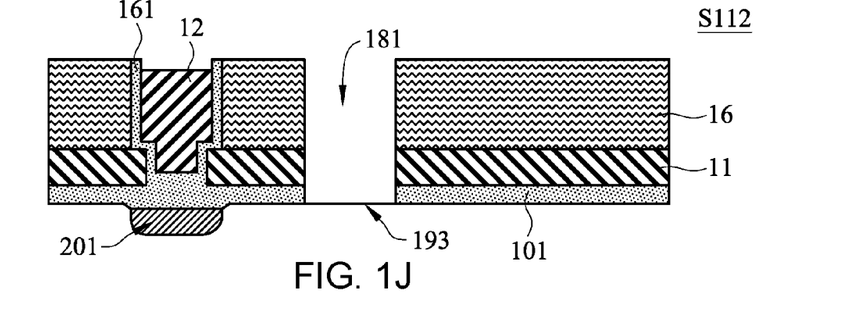

Please refer to FIG. 1J. A third pattern opening 193 is defined at the substrate 10 and the first polycrystalline silicon layer 11 above the third pattern opening 193 is removed. The third pattern opening 193 is disposed above the second pattern opening 192 where the interval formed by two adjacent the sacrificial layers 16 or the projection of the wide part of the damascene trench 17 along the horizontal direction. Therefore, along the horizontal direction, the width of the third pattern opening 193 is wider than that of the second pattern opening 192. Therefore, the first polycrystalline silicon layer 11 at the two sides of the second pattern opening 192 is removed, so the first polycrystalline silicon layer 11 and the stacked sidewall of the sacrificial layers 16 are aligned in a straight line.

In addition, the base dielectric layer 101 under the third pattern opening 193 is removed along the depth direction. The substrate 10 above the third pattern opening 193 does not cover any material. The interval between the first polycrystalline silicon layer 11 and the sacrificial layers 16 form a first groove 181 on the substrate 10.

Figure 1K:
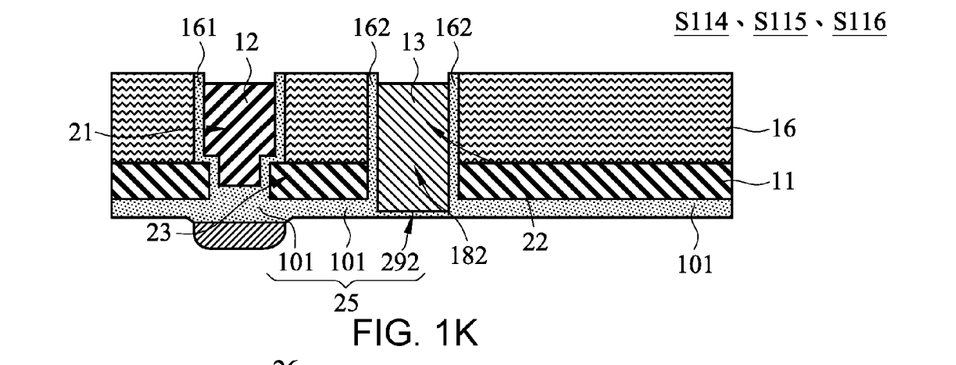

Please refer to FIG. 1K. After removing the base dielectric layer 101 under the third pattern opening 193 (S113), at the third pattern opening 193 the bottom of the first groove 181 of the substrate 10 does not cover any material. By the means of lithography the region outside the third pattern opening 193 is defined as a mask. The transistor dielectric layer 292 is oxidized or deposited at the bottom of the first groove 181 of the substrate 10.

In addition, above the projection of the third pattern opening 193 has two adjacent stacked first polycrystalline silicon layer s11 and the vertical sidewall of sacrificial layer 16. A second sidewall dielectric layer 162 is formed at two sides of the first groove 181 (S115). The second sidewall dielectric layer 162 is disposed above the third pattern opening 193 and two sides of the first groove 181. The second sidewall dielectric layer 162 connects the transistor dielectric layer 292 at the bottom, and isolated the stacked structures of two sides of the first polycrystalline silicon layer 11 and the sacrificial layer 16, and the stacked structures have a relative wide base that tapering upward the top, Therefore, the transistor dielectric layer 292 formed at the bottom of the first groove 18 on the substrate 10 and the sidewall dielectric layer 162 formed on the first groove 181 together forms a second groove 182. The width of the second groove 182 is narrower than the third pattern opening 193 along the horizontal direction.

In one embodiment, the transistor dielectric layer 292 has high-k dielectric material or low-k dielectric material, such as nitrided silicon oxide (SiON), zirconium oxide ($HfO_2$), or tantalum pentoxide ($Ta_2O_5$). Furthermore, the base dielectric layer 101 at the second pattern opening 192 will maintain a thickness thinner than 20 nm, which is the thickness of equivalent oxide thickness, EOT). Except the above said steps, present invention could also include steps like annealing process or other defect reducing or removing process for the base dielectric layer 101.

Please refer to FIG. 1K, by the means of lithography the region outside the third pattern opening 193 on the photoresist is defined as a mask, and a third polycrystalline silicon layer 13 is formed. The third polycrystalline silicon layer 13 is formed in the second grooves 182 (S116). According to the interval formed by the third pattern opening 193, the first polycrystalline silicon layer 11. the scarifying layer 16 and the first sidewall dielectric layer 161, the selective gate (SG) 22 of the third polycrystalline silicon layer 13 is formed on the transistor dielectric layer of the third pattern opening 193. For example, by the means of high temperature oxidation or chemical vapor deposition, after disposing the poly-Si, the poly crystalline silicon is etched to a predetermined thickness to form into the erase gate (EG) 21 and selective gate (SG) 22.

It should be noted that in different patches and different manufacturing process, along the horizontal direction the first dielectric layer 25 is defined, The first dielectric layer 25 includes a thicken base dielectric layer 101 under the erase gate (EG) 21, a transistor dielectric layer 292 formed on the substrate 10 under the selective gate (SG) 22 and the base dielectric layer 101 under the floating gate (FG) 23.

Figure 1L:
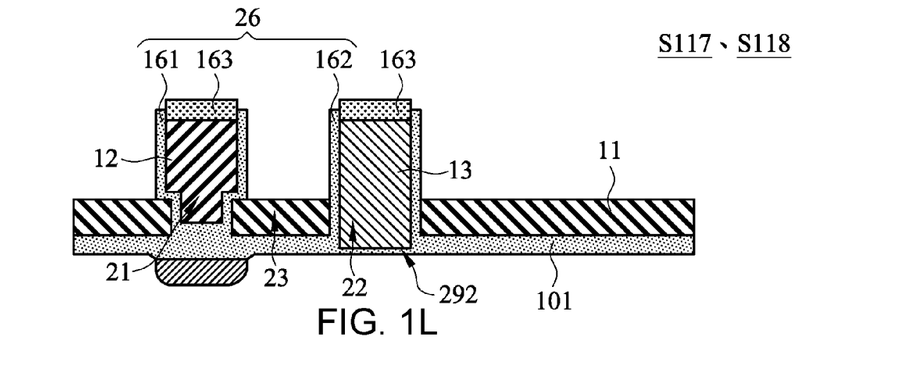

Please refer to FIG. 1L. The covering dielectric layer 163 is formed at the erase gate (EG) 21 of the second polycrystalline silicon layer 12 and the selective gate (SG) 22 of the third polycrystalline silicon layer 13. For example, by the means of high temperature oxidation the second polycrystalline silicon 12 or chemical vapor deposition the covering dielectric layer 163, the covering dielectric layer 163 will be etched to a predetermined thickness. Then defines the damascene trenches 17 above the first pattern opening 191 and the region of the first groove 181 as a mask via lithography. Removes the stacked the covering dielectric layer 163 on the first polycrystalline silicon layer 11.

To be noted that, it is made in different patches and different manufacturing process. The second dielectric layer 26 has a first sidewall dielectric layer 161, the banned adjacent first sidewall dielectric layer 161 is disposed above the first pattern opening 191 to form a wide top and and narrow base structure that surrounds the erase gate (EG) 21. Then, the second dielectric layer 26 has a second sidewall dielectric layer 162 and the adjacent vertical second sidewall dielectric layer 26 is disposed above the third pattern opening 193 that surrounds the selective gate (SG) 22. The second dielectric layer 26 further includes the covering dielectric layer 163 that covers the erase gate (EG) 21 and the selective gate (SG) 22.

Figure 1M:
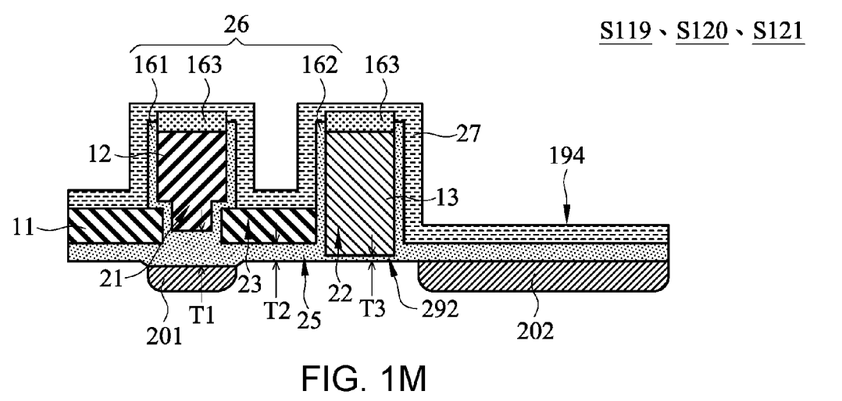

Please refer to FIG. 1M. Portion of the first polycrystalline layer 11 is removed. Via the lithography, on the photoresist a pattern is defined as a mask. The first polycrystalline layer 11 near the third polycrystalline layer 13 and away from the second polycrystalline layer 12 is removed. That is, the first polycrystalline silicon layer 11 nears the selective gate (SG) 22 and away the floating gate (FG) 23 is removed. For example, by reactive ion etching or by wet etching the silicon nitride of the first polycrystalline silicon layer 11 is removed, and above said layers are not affected.

According, a coupled dielectric layer 27 is formed (S120). On the first polycrystalline silicon layer 11, the covering dielectric layer 151 and the first sidewall dielectric layer 161 deposits the coupled dielectric layer 27, directly deposit the coupled dielectric layer 27 on the base dielectric layer 101. For instance, by the mean of chemical vapor deposition (CVD), the stacked oxide-nitride-oxide (ONO) layer or the high-k dielectric material is disposed. Therefore, at the region of the coupled dielectric layer 27 on the base dielectric layer 101 a fourth pattern opening 104 is defined along the depth direction.

In addition, by the means of lithography, the patterned photoresist could be used as a mask to perform ion implantation according to the fourth pattern opening 194, and forms a drain region 202 at the surface of the substrate 10 (S121). Via performing ion implantation according to the fourth pattern opening 194, a drain region 202 will be formed at the dielectric layer 101 and the coupled dielectric layer 27 stacked region along the depth direction. Only portion of the first dielectric layer 25 of the dielectric layer 15 and the coupled dielectric layer 27 is stacked above the drain region 202. A channel region 203 is formed between the source region 201 and the drain region 202.

Figure 1N:
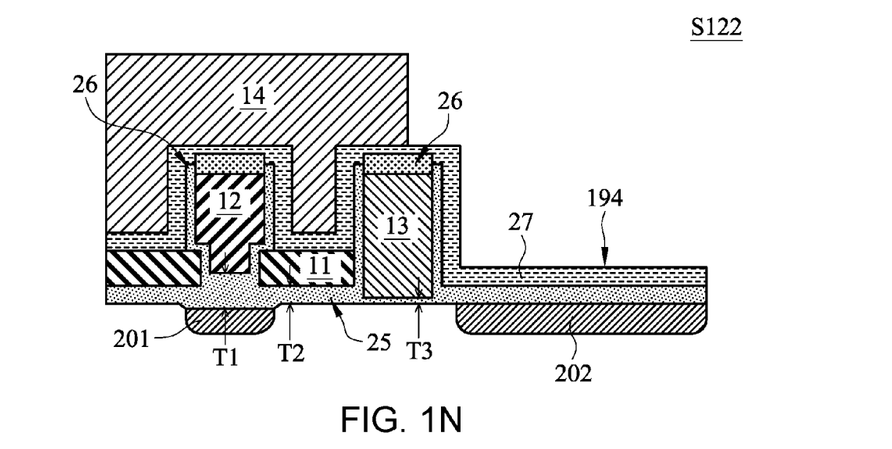

Finally, please refer to FIG. 1N, forming the forth polycrystalline silicon layer 14 (S122). The fourth polycrystalline silicon layer 14 is deposited and formed into a fourth-polycrystalline silicon couple control gate (CG) 24 and covers the above said coupled dielectric layer 27. According to the method of the non-volatile memory unit (S1), the memory unit 2 is made in sequence.

Others, non-volatile memory unit 2 of fourth-polycrystalline silicon split gate is made. Dispose the first polycrystalline silicon layer 11 (S103) to form the floating gate (FG) 23 of the first polycrystalline silicon. Dispose the second polycrystalline silicon layer 12 (S109) to form the erasing gate (EG) 21 of the second polycrystalline silicon. Dispose the third polycrystalline silicon layer 13 (S116) to form the selective gate (SG) 22 of the third polycrystalline silicon. Dispose the fourth polycrystalline silicon layer 14 (S122) to form the selective gate (SG) 22 of the fourth polycrystalline silicon.

In one embodiment, the erase gate (EG) and the first pattern opening 191 are made in different patches and different manufacturing process. The first dielectric layer 25 has a first thickness T1 that range between 300-600 nm, the floating gate (FG) 23 along the depth direction. The second thickness T2 of the first dielectric layer 25 is range between 50-150 nm, preferably 100 nm. The selective gate (SG) 22 and the third pattern opening 193 along the depth direction, the transistor dielectric layer 292 of base dielectric layer 101 has a third thickness range between 10-150 nm. Except the above said steps, present invention could also include steps like annealing process or other defect reducing or removing process.

As for damascene, usually at the dielectric layer, form a silicon dioxide ($SiO_2$) or Silicon nitride ($Si_3N_4$) layer as a hard mask. In the later process, such as removing photoresist, the hard mask could avoid the dielectric layer being destroyed during the etching process. Furthermore, part of the structure could apply the buried hard mask technique, with an etching stop layer or hard mask design could eliminate the alignment error during the structure constructing process.

The first polycrystalline silicon layer 11, the scarifying layer 16 and the first sidewall dielectric layer 161 together stacked in a pile or mountain shape. Back-filling and back-etching the patterned second polycrystalline silicon layer 12, an erase gate (EG) 21 is formed (S114). Before disposing selective gate (SG) 22 the transistor dielectric layer 292 of the selective gate (SG) 22 is independently manufactured (S114). And the first dielectric layer 25 will be disposed below the projection of the floating gate (FG) 23 is floating gate dielectric layer 293. At the first dielectric layer 25 below the projection of the selective gate (SG) is the transistor dielectric layer 292 of the selective gate (SG) 22. The first sidewall dielectric layer 161 is disposed between the erase gate (EG) 21 and the floating gate (FG) 23, which the tunneling dielectric layer 291 of the erase gate (EG) 21.

On the other hand, the above said initial the sacrificial layer 16 could be made of the combination of the sacrificial layer 16 and the first polycrystalline silicon layer. After the later on removal of the sacrificial layer 16, the polycrystalline silicon become part of the damascene hard mask and as a floating gate 23 (FG). After removing the sacrificial layer 16, no need for addition back-filling or planarization of the polycrystalline silicon of the floating gate 23 (FG).

Thus, in order to independently produce the tunneling dielectric layer 291 of the erase gate (EG) 21 and the transistor dielectric layer 292 of the selective gate (SG) 22, one of the remove and refilled polycrystalline silicon gate (normal SG) could be use and select for inserting extra polycrystalline silicon refill and flattening process. Continuous disposing and dry/wet etching of the silicon nitride and silicon oxide is contributed to erase the substrate of the erase gate (EG) 21 and the selective gate (SG) 22. The tunneling dielectric layer 291 and the transistor dielectric layer 292 are selectively connected.

The non-volatile memory unit 2 of the present invention programs a low power hot electron injection programming, and a high reliability poly silicon and poly silicon tunneling and erasing, and low voltage logically compatible character. By rapidly program the logically compatible oxide layer of the selective gate damascene (SG WL) at low voltage, the programmed voltage and current could be precisely control.

More important, since the present invention will be integrated with other advanced logic compatibility to scale down in size, the programming voltage will be easily reached. The transistor oxide layer of the selective gate damascene could integrate to allow the maximum current output. The above non-volatile memory unit of split gate is made of damascene process, and could be used with conventional flattening unit structure such FINFET. There will be no difficult for additional scaling down.

Figure 2:
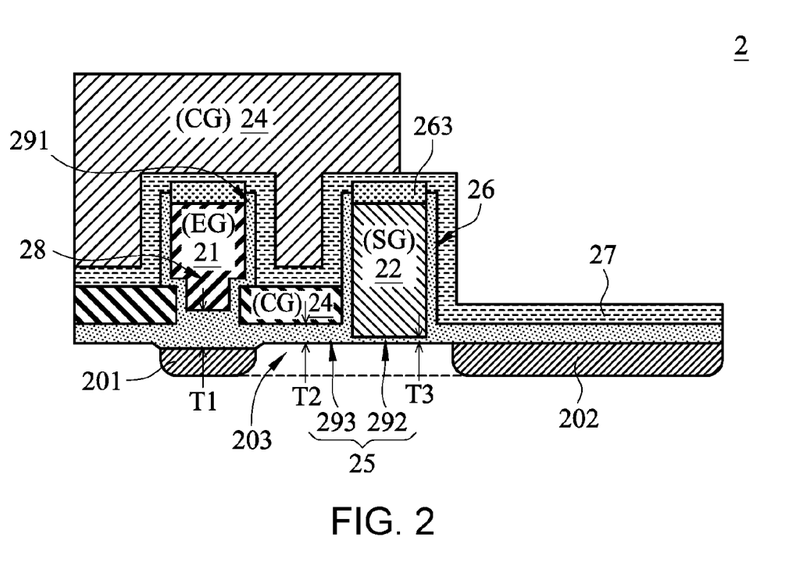
FIG. 2 is cross-sectional views of the non-volatile memory unit in accordance the present invention.

Please refer to FIG. 2, present invention is related to a non-volatile memory unit 2, particularly to a non-volatile memory unit 2 of tri-polycrystalline silicon split gate. The non-volatile memory unit 2 includes a substrate 10, which at the surface of the substrate 10 has a source region 201 and a drain region 202 that separated by a channel region 203. Then, a first dielectric layer 25 is formed on the substrate 10. The first dielectric layer 25 has a first pattern opening 191, which could define the source region 201 along the depth direction.

A floating gate (FG) 23 is formed on the first dielectric layer 25, and the floating gate (FG) 23 is near the erase gate (EG) 21. The floating gate (FG) 23 is inserted into the narrow portion of a groove 18 with wide top and narrow base. The wide portion of the groove 18 is overlapped with the projection of the floating gate (FG) 23. At the step S103 of formed the first polycrystalline silicon layer 11, above the first polycrystalline silicon layer 11 is disposed between the first pattern opening 191 and the second pattern opening 192 is the second polycrystalline silicon layer 12. The first polycrystalline silicon layer is disposed between the erase gate (EG) 21 and the selective gate (SG) 22.

Then, forming a selective gate (SG) 22 on the the first dielectric layer 25, the selective gate (SG) is disposed above the projection of the second pattern opening 192 along the depth direction, and the selective gate (SG) 22 is adjacent to the floating gate (FG) 23. The selective gate (SG) 22 and the floating gate (FG) 23 are disposed above the projection of the channel region 203. At the step S115 of formed the third polycrystalline silicon layer 13, above the first dielectric layer 25 if the third pattern opening 193 the selective gate (SG) is formed. Wherein the first dielectric layer further comprises a transistor dielectric layer 292

Between the erase gate (EG) 21 and the selective gate (SG) 22 and the floating gate (FG) 23 and the selective gate (SG) 22, forms a first sidewall dielectric layer 161 (S108). At the step 108, the first sidewall dielectric layer 161 is deposit on the floating gate (FG) 23 and the sacrificial layer 16. More important, at the first pattern opening 191 along the horizontal direction, adjacent first sidewall dielectric layer 161 is wide at top and narrow at bottom. At the third pattern opening 193 along the horizontal direction, adjacent second sidewall dielectric layer 162 Therefore, at the interval between the two adjacent scarifying layers 16 includes the selective gate (SG) 22 and the second sidewall dielectric layer 162.

Accordingly, a coupled dielectric layer 27 is formed on the erase gate (EG) 21, the floating gate (FG) 23, the selective gate (SG) 22 and the first sidewall dielectric layer 161. At the step S114 of formed the coupled dielectric layer 27, the coupled dielectric layer 27 covers and forms on the top of the above said layers. Please refer to 1M, the coupled dielectric layer 27 is formed into a continuous concave and convex shape and covers the second dielectric layer 26, the erase gate (EG) 21, the selective gate (SG) 22 and the floating gate (FG) 23. Otherwise, the coupled dielectric layer 28 is covered along the first dielectric layer 25 and the first sidewall dielectric layer 161, so it is disposed on first dielectric layer 25 and the above the fourth pattern opening 194 along the depth direction. Also, the coupled dielectric layer 27 is close to a side of the selective gate (SG) 22 of the first sidewall dielectric layer 161 of the fourth pattern opening 194.

Last but not least, the couple control gate (CG) 24 is formed on the coupled dielectric layer 27. Therefore, in present invention the first pattern opening 191 of the first dielectric layer 25 has a first thickness T1, along the depth direction and below the projection of the floating gate (FG) 23 of the first dielectric layer 25 is defined as a second thickness T2, and along the depth direction below the projection of the selective gate (SG) 22 is defined as a third thickness T3. The first thickness T1 is thicker than the second thickness T2, and the second thickness is thicker than the third thickness T3.

Furthermore, the first dielectric layer 161 is disposed between the erase gate (EG) 21 and the floating gate (FG) 23, thus is disposed at the tunneling dielectric layer 291 of the erase gate (EG) 21. The second sidewall dielectric layer 162 is disposed between the selective gate (SG) 22 and the floating gate (FG) 23. Others, the first dielectric layer 25 is disposed under the projection of the selective gate (SG) 22, that is, the transistor dielectric layer 292 of the selective gate (SG) 22. The base dielectric layer 101 is disposed under the projection of the floating gate (FG) 23, that is, the floating gate dielectric layer 293 of the floating gate (FG) 23.

In one embodiment, the first dielectric layer 25 has a third pattern opening 193, which is defined by the source region 201 along the depth direction. The first dielectric layer 25 has a fourth pattern opening 194, which defined by the selective gate (SG) 22 along the depth direction. The fourth pattern opening 194 is defined by the source region 202 along the depth direction.

During the electron erasing period, the trapping of the tunneling oxide layer is considered as the major reason of narrowing the operating cycle and the decaying the withstand voltage. Usually, the silicon oxide growing at high temperature or CVD of silicon hydride ($SiH_4$) reaction could form the oxide layer both are fine tunneling dielectric layer 291. By depicting the content of the nitride in the silicon oxide, the silicon oxide is processed by the nitrogen oxide (NO) or the nitrous oxide ($N_2O$), in order to reduce the trap density at the interface of the silicon oxide and silicon oxide-silicon oxide.

Silicon oxide contains excess nitride will become serious electron trap, in some extreme cases such as SONOS. Film with abundance nitride could be used as a storage media of the electrons but not for obvious tunneling route. Therefore, the content of the nitride of the silicon oxide has to be control. In the present invention, the major advantage of the sequence in the process is that the first sidewall dielectric layer 161, the transistor dielectric layer 292 of the selective gate (SG) 22 could be independently manufactured.

Please refer to FIG. 1G, the high-k dielectric material is used in the transistor of the selective gate (SG) 22 (includes nitride-oxide-silicon complex.) Since logic circuit and the technique node of the major data stream scale down, after removing the scarifying layer 12, the tunneling effect of the first sidewall dielectric 161 will not be affected. The nitride-oxide-silicon complex (SiON) could be used as the dielectric layer of the selective gate (SG) 22. By the means of the conventional method, the nitric oxide (NO) and the nitrous oxide ($N_2O$) of the tunneling dielectric layer 291 is improved, in order to control the nitrous content in the nitride-oxide-silicon complex. Using high-k dielectric material such as $HfO_2$—$Ta_2O_5$ for dielectric of selective gate (SG) 22. The high-k dielectric material has narrowband and could improve the tunneling effect of the transistor dielectric 292.

Figure 3:
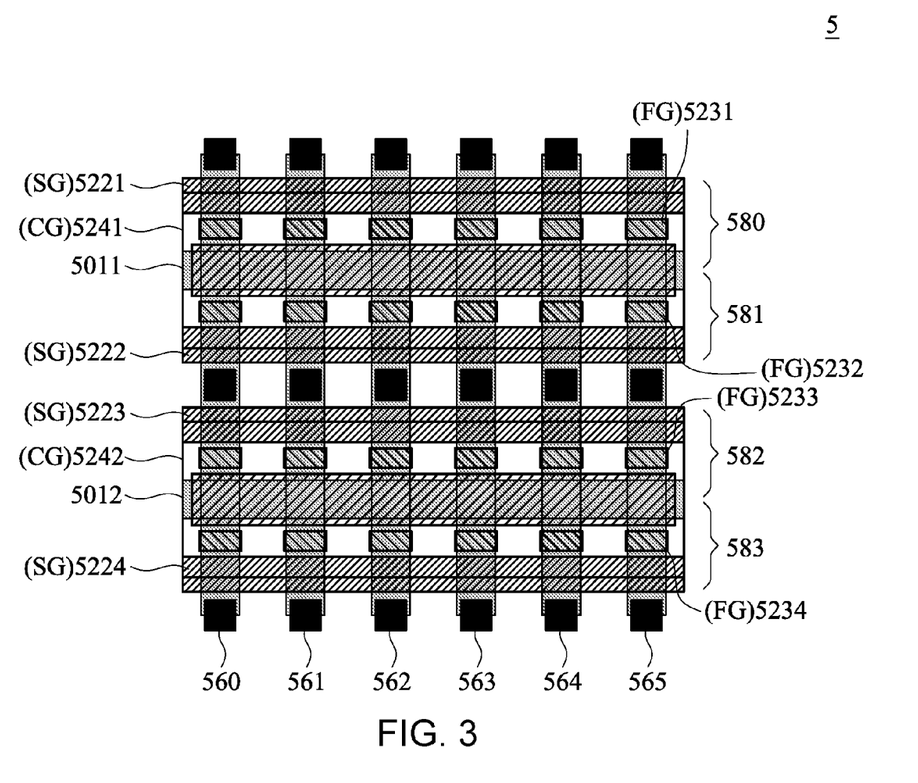
FIG. 3 is a schematic view illustrating the non-volatile memory unit array according to the present invention.

Please refer to FIG. 3, which shows a diagrammatic view illustrating the non-volatile memory unit array 5 that configured by non-volatile memory units 2 according to the present invention. Only part of the top surface of the non-volatile memory unit array 5 is shown in the top view. The non-volatile memory unit array 5 has several non-volatile memory units 2 that are arranged as a chess board pattern. More precisely, non-volatile memory units 2 are arranged along first direction X and second direction Y which is mutual vertical to each other. There are 24 sets of non-volatile memory units 2, shown in FIG. 3, 6 sets are arranged in first direction X and 4 sets are arranged in second direction Y.

Accordingly, selective gate (SG) 22 of each row is connected via the first direction X, and is electrical connected as shown in 5221, 5222, 5223 and 5224. The source region 201, shared each two adjacent columns of non-volatile memory units 2. As shown as 5011 and 5012, the shared source regions 201 at the same row connected via the first direction X and are electrical connected. As shown as 5241 and 5242, the shared couple control gate (CG) of each adjacent non-volatile memory units in every column via the first direction X and are electrical connected.

As shown as bit lines 560, 561, 562, 563 and 564, the source regions 202 at each column is connected through a through hole via a metal layer along the second direction Y are electrical connected. These floating gates (FG) 23 are independent and do not intersect with each other. The floating gates (FG) 23 are electrical insulated and do no connect with outside, in order to store the storing status of the non-volatile memory units 2. As shown in 5231, 5232, 5233 and 5234, the word lines 580, 581, 582 and 583 of the non-volatile memory units 2 are disposed correspondingly to each the floating gates (FG) 23.

Below will explain the detail the operation method of the non-volatile memory unit array 5 configured by non-volatile memory units 2. As for non-volatile memory unit array's structure of the present invention, partial erase operation could be applied at any two adjacent rows of the shared source region 201. For example, erasing the word lines 582-583 of non-volatile memory units 2, more precisely erasing the two rows where the word lines 582-583 are disposed. At the shared source region 201, a 6V voltage is applied, and a negative 9V voltage is applied at the couple control gate (CG) 5242. Therefore, the electrons are removed from the floating gate (FG) 23 and tunneling to the source region 201. Then the equivalent polarity of these two rows of the floating gate (FG) 5233, 5234 will be positive voltage.

While undergoes an operation of writing "0", such as undergoes an operation of writing "0" at the word lines 582 of the non-volatile memory units 2. For example, 5-6 V is applied at the at source region 5012, 9V is applied at the couple control gate (CG) 5242, 0V is applied at drain region 202, 1V is applied at and the selective gate (SG) 5223. By the mechanism of the hot-electron injection, electrons are removed from the high electric field region of the channel to the floating gate (FG) 5233. Thus, the equivalent polarity of the floating gate (FG) 5233 will be negative voltage.

Perform a reading operation, such as a reading operation for word lines of non-volatile memory units 2. Applied 0V at source region 5012 and couple control gate (CG) 5242, or applied 1V at source region 202 applied and a supply voltage $V_{cc}$ at selective gate (SG) 5223. The channel below the selective gate (SG) 5223 will be on. Wherein the supply voltage $V_{cc}$ is the supply voltage of the memory circuit, in conventional amplifier using 0.18 micro CMOS technology, the supply voltage $V_{cc}$ will be 1.8 V.

Assume that the status of the word lines 582 of the non-volatile memory units 2, are "0", that is the equivalent polarity of the floating gate (FG) 5233 will be negative voltage and the current in the channel is proximally 0. On the other hand, the status of word lines 582 of the non-volatile memory units 2 are "1", that is the equivalent polarity of the floating gate (FG) 5233 will be positive voltage. During then, the current exist in the channel is about 30 nm. By detecting the channel current of the channel region 203, the storage content of the non-volatile memory units 2, are known.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope.

Accordingly, the scope of the present disclosure is defined by the appended claims rather than the foregoing description and the exemplary embodiments described therein.

What is claimed is:

1. A non-volatile memory unit comprising:
   a substrate, wherein a source region and a drain region are formed on the surface, and the source region and the drain region are separated apart via a channel region;
   a first dielectric layer, formed on the substrate and defining a first pattern opening along the depth direction on the first dielectric layer;
   an erase gate (EG), formed on the first dielectric layer and is disposed upon a projection of the first pattern opening along the depth direction;
   a floating gate (FG), formed on the first dielectric layer and near the erase gate;
   a selective gate (SG), formed on the first dielectric layer and near the floating gate, wherein the selective gate and the floating gate are disposed upon the channel region's projection along the depth direction;
   a second dielectric layer, formed on the first dielectric layer and covering the erase gate and the selective gate, wherein the floating gate is disposed between two adjacent second dielectric layers;
   a coupled dielectric layer, formed on the erase gate, the floating gate, the selective gate and the second dielectric layer; and
   a couple gate (CG), formed on the coupled dielectric layer;
   wherein the first pattern opening of the first dielectric layer has a first thickness, the thickness of the first dielectric layer below the projection of the floating gate (FG) is defined as a second thickness, and the thickness of the first dielectric layer below the projection of the selective gate (SG) is defined as a third thickness,
   wherein the first thickness is thicker than the second thickness, and the second thickness is thicker than the third thickness.

2. The non-volatile memory unit of claim 1, wherein the projection of the relative narrow portion of the erase gate (EG) that disposed at the damascene grooves is disposed above the first pattern opening along the depth direction, and the erase gate (EG) is narrower than the first pattern opening along the horizontal direction, wherein the damascene grooves have a relative wide base that tapering upward the top.

3. The non-volatile memory unit of claim 1, wherein the second dielectric layer is disposed between the two sides of the erase gate (EG) and the second dielectric layer is formed between the erase gate (EG) and the floating gate (FG).

4. The non-volatile memory unit of claim 1, wherein the coupled dielectric layer is formed into a continuous concave and convex shape and covers the second dielectric layer, the erase gate (EG), the selective gate (SG) and the floating gate (FG), along the depth direction the coupled dielectric layer on the floating gate is relatively near the first dielectric layer corresponding to the erase gate (EG) and the selective gate (FG).

5. The non-volatile memory unit of claim 1, wherein the first dielectric layer comprises a transistor dielectric layer and a base dielectric layer.

6. The non-volatile memory unit of claim 1, wherein the second dielectric layer comprises a covering dielectric layer, a first sidewall dielectric layer and a second sidewall dielectric layer.

* * * * *